(12) United States Patent
Hori

(10) Patent No.: US 10,700,169 B2
(45) Date of Patent: Jun. 30, 2020

(54) SILICON CARBIDE SINGLE CRYSTAL SUBSTRATE, SILICON CARBIDE EPITAXIAL SUBSTRATE, AND METHOD OF MANUFACTURING SILICON CARBIDE SEMICONDUCTOR DEVICE

(71) Applicant: SUMITOMO ELECTRIC INDUSTRIES, LTD., Osaka (JP)

(72) Inventor: Tsutomu Hori, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/365,172

(22) Filed: Mar. 26, 2019

(65) Prior Publication Data
US 2019/0221647 A1    Jul. 18, 2019

Related U.S. Application Data

(63) Continuation of application No. 15/772,183, filed as application No. PCT/JP2016/072775 on Aug. 3, 2016, now Pat. No. 10,283,596.

(30) Foreign Application Priority Data

Nov. 24, 2015    (JP) .................................. 2015-228517

(51) Int. Cl.
*H01L 29/16*    (2006.01)
*H01L 21/02*    (2006.01)
(Continued)

(52) U.S. Cl.
CPC ........ *H01L 29/1608* (2013.01); *C30B 25/186* (2013.01); *C30B 25/20* (2013.01);
(Continued)

(58) Field of Classification Search
CPC .......... H01L 29/1608; H01L 29/66053; H01L 29/66075
See application file for complete search history.

(56) References Cited

U.S. PATENT DOCUMENTS

2012/0325196 A1    12/2012 Okita et al.
2015/0279887 A1*   10/2015 Uematsu ............. H01L 27/1462
                                                              257/432

FOREIGN PATENT DOCUMENTS

JP    2007-301688 A    11/2007
JP    2013-258243 A    12/2013
(Continued)

OTHER PUBLICATIONS

J. Quast et al., "High Quality 150 mm 4H SiC Wafers for Power Device Production," Materials Science Forum, vol. 821-823, p. 56-59. [Cited in Communication issued in Japan Patent Application dated Nov. 26, 2019].

(Continued)

*Primary Examiner* — Hoai V Pham
(74) *Attorney, Agent, or Firm* — Baker Botts L.L.P.; Michael A. Sartori

(57) ABSTRACT

A silicon carbide single crystal substrate includes a first main surface and an orientation flat. The orientation flat extends in a <11-20> direction. The first main surface includes an end region extending by at most 5 mm from an outer periphery of the first main surface. In a direction perpendicular to the first main surface, an amount of warpage of the end region continuous to the orientation flat is not greater than 3 μm.

13 Claims, 12 Drawing Sheets

(51) Int. Cl.
    *C30B 29/36*     (2006.01)
    *C30B 25/18*     (2006.01)
    *C30B 25/20*     (2006.01)
    *C30B 29/00*     (2006.01)
    *H01L 29/04*     (2006.01)
    *H01L 29/66*     (2006.01)

(52) U.S. Cl.
    CPC .............. *C30B 29/00* (2013.01); *C30B 29/36* (2013.01); *H01L 21/02* (2013.01); *H01L 21/02002* (2013.01); *H01L 21/0262* (2013.01); *H01L 21/02378* (2013.01); *H01L 21/02433* (2013.01); *H01L 21/02529* (2013.01); *H01L 29/045* (2013.01); *H01L 29/66068* (2013.01)

(56) References Cited

FOREIGN PATENT DOCUMENTS

| JP | 2014-170891 A | 9/2014 |
|---|---|---|
| JP | 2015-135902 A | 7/2015 |
| JP | 2015-189633 A | 11/2015 |

OTHER PUBLICATIONS

Cree Silicon Carbide Substrates and Epitaxy. MAT-CATALOG. 00Q. [online]. Cree, Inc., 2013. [retrieved on Apr. 5, 2019].

A. A. Burk et al., SiC Epitaxial Layer Growth in a 6×150 mm Warm-Wall Planetary Reactor, CH, Materials Science Forum, vols. 717-720(2012), Trans. Tech. Publications, pp. 75-80.

Y. Gao et al., High Quality 100 mm 4H-SiC Substrate, CH, Materials Science Forum, vols. 821-823 (2015), Trans. Tech. Publications, p. 51-55.

H. Tsuchida et al., Formation of Extended Defects in 4H-SiC Epitaxial Growth, JP, J. Vac. Soc. Jpn., 2011, vol. 54, No. 6, p. 353-361.

Office Action dated May 7, 2019 in JP Divisional Patent Application No. 2017-043780.

\* cited by examiner

SILICON CARBIDE SINGLE CRYSTAL SUBSTRATE, SILICON CARBIDE EPITAXIAL SUBSTRATE, AND METHOD OF MANUFACTURING SILICON CARBIDE SEMICONDUCTOR DEVICE

TECHNICAL FIELD

The present disclosure relates to a silicon carbide single crystal substrate, a silicon carbide epitaxial substrate, and a method of manufacturing a silicon carbide semiconductor device. The present application is a continuation of U.S. patent application Ser. No. 15/772,183, filed on Apr. 30, 2018, which is a U.S. National Phase application under 35 U.S.C. § 371 of International Application No. PCT/JP2016/072775, filed on Aug. 3, 2016, which claims priority to Japanese Patent Application No. 2015-228517, filed on Nov. 24, 2015. The International Application was published in Japanese on Jun. 1, 2017 as WO 2017/090279 A1 under PCT Article 21(2). The entire contents of all of the above-noted applications are herein incorporated by reference.

BACKGROUND ART

Japanese Patent Laying-Open No. 2014-170891 (PTD 1) discloses a method of epitaxially growing a silicon carbide layer on a silicon carbide single crystal substrate.

CITATION LIST

Patent Document

PTD 1: Japanese Patent Laying-Open No. 2014-170891

SUMMARY OF INVENTION

A silicon carbide single crystal substrate according to the present disclosure includes a first main surface and an orientation flat. The orientation flat extends in a <11-20> direction. The first main surface includes an end region extending by at most 5 mm from an outer periphery of the first main surface. In a direction perpendicular to the first main surface, an amount of warpage of the end region continuous to the orientation flat is not greater than 3 µm.

DESCRIPTION OF EMBODIMENTS

Figure 1:
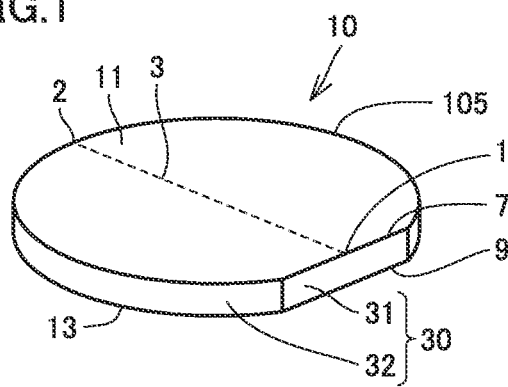
FIG. 1 is a schematic perspective view showing a construction of a silicon carbide single crystal substrate according to the present embodiment.

[Overview of Embodiment of the Present Disclosure]

Overview of an embodiment of the present disclosure will initially be described. In the description below, the same or corresponding elements have the same reference characters allotted and the same description thereof will not be repeated. Regarding crystallographic denotation herein, an individual orientation, a group orientation, an individual plane, and a group plane are shown in [ ], < >, ( ) and { }, respectively. A crystallographically negative index is normally expressed by a number with a bar "-" thereabove, however, a negative sign herein precedes a number.

(1) A silicon carbide single crystal substrate 10 according to the present disclosure includes a first main surface 11 and an orientation flat 31. Orientation flat 31 extends in a <11-20> direction. First main surface 11 includes an end region 103 extending by at most 5 mm from an outer periphery 105 of first main surface 11. In a direction perpendicular to first main surface 11, an amount of warpage 101 of end region 103 continuous to orientation flat 31 is not greater than 3 µm.

A silicon carbide single crystal substrate is normally obtained by cutting a silicon carbide single crystal ingot with a wire saw. In cutting a silicon carbide ingot with a wire saw, ideally, the wire saw is introduced substantially perpendicularly to a side surface of the silicon carbide single crystal ingot. At the time of start of cutting, however, an angle of introduction of the wire saw with respect to the side surface of the silicon carbide single crystal ingot is not stable and the wire saw may obliquely be introduced into the side surface. A carbon plane is physically cut more readily than a silicon plane. Therefore, the wire saw tends to move toward the carbon plane. Consequently, a cut surface of the silicon carbide single crystal ingot (in other words, a front surface and a rear surface of the cut silicon carbide single crystal substrate) tends to be curved toward the carbon plane at the time of start of cutting of the silicon carbide single crystal ingot. Therefore, an outer edge of the front surface of the cut silicon carbide single crystal substrate may be warped upward in a direction away from the rear surface of the silicon carbide single crystal substrate or downward in a direction toward the rear surface on the contrary.

In particular, when an end region of the front surface of the silicon carbide single crystal substrate continuous to an orientation flat is greatly warped (specifically, more than 3 µm), a stacking fault tends to develop from the orientation flat into a silicon carbide layer in forming the silicon carbide layer on the silicon carbide single crystal substrate through epitaxial growth. Therefore, an amount of warpage of the end region (that is, an amount of warpage upward or downward) is desirably reduced (specifically to 3 µm or smaller).

As a result of studies, the inventors have conceived of arranging a protection portion in a form of a plate on an orientation flat of a silicon carbide single crystal ingot in cutting the silicon carbide single crystal ingot with a wire saw, thereafter cutting the protection portion first, and in succession, cutting the silicon carbide single crystal ingot. Though a cut surface of the protection portion which is cut first may be curved with respect to a side surface of the protection portion, the cut surface will gradually be substantially perpendicular to the side surface. Therefore, the silicon carbide ingot cut in succession to the protection portion is cut substantially perpendicularly to the side surface thereof. Consequently, an amount of warpage of the end region can be reduced. Specifically, an amount of warpage of the end region can be not greater than 3 µm. Consequently, a stacking fault which develops from the orientation flat into the silicon carbide layer during epitaxial growth can be lessened.

(2) In silicon carbide single crystal substrate 10 according to (1), when a cross-section which divides orientation flat 31 perpendicularly into two equal sections when viewed in the direction perpendicular to first main surface 11 is viewed, toward orientation flat 31, end region 103 may be warped upward in a direction away from a surface 13 opposite to first main surface 11. Amount of warpage 101 may represent a distance between a point of contact 7 between orientation flat 31 and first main surface 11 and a point 6 where a least square line 4 calculated from a cross-sectional profile 15 of first main surface 11 in a region 102 extending from a position distant by 3 mm from orientation flat 31 toward a center 5 of first main surface 11 to a position distant by 5 mm therefrom intersects with orientation flat 31.

(3) In silicon carbide single crystal substrate 10 according to (1), when a cross-section which divides orientation flat 31 perpendicularly into two equal sections when viewed in the direction perpendicular to first main surface 11 is viewed, toward orientation flat 31, end region 103 may be warped downward in a direction toward surface 13 opposite to first main surface 11. Amount of warpage 101 may represent a distance between point of contact 7 between orientation flat 31 and first main surface 11 and point 6 where least square line 4 calculated from cross-sectional profile 15 of first main surface 11 in region 102 extending from a position distant by 3 mm from orientation flat 31 toward center 5 of first main surface 11 to a position distant by 5 mm therefrom intersects with a virtual plane 36 extending along orientation flat 31.

(4) In silicon carbide single crystal substrate 10 according to any of (1) to (3), amount of warpage 101 may be not greater than 2 µm.

(5) In silicon carbide single crystal substrate 10 according to (4), amount of warpage 101 may be not greater than 1 µm.

(6) A silicon carbide epitaxial substrate 100 according to the present disclosure may include silicon carbide single crystal substrate 10 described in any of (1) to (5) and a silicon carbide layer 20. Silicon carbide layer 20 is located on first main surface 11. Silicon carbide layer 20 includes a second main surface 12 opposite to a surface 14 in contact with first main surface 11. Second main surface 12 is free from a stacking fault extending in a <1-100> direction from orientation flat 31 and having a length not shorter than 1 mm.

(7) In silicon carbide single crystal substrate 10 according to any of (1) to (5), when a line segment 3 which divides orientation flat 31 perpendicularly into two equal sections is divided into four equal sections when viewed in the direction perpendicular to first main surface 11, first main surface 11 may include a lower region 41 extending from orientation flat 31 to a position 44 corresponding to ¼ of line segment 3. Amount of warpage 101 of end region 103 continuous to an end portion 33 of lower region 41 is not greater than 3 µm.

(8) Silicon carbide epitaxial substrate 100 according to the present disclosure may include silicon carbide single crystal substrate 10 described in (7) and silicon carbide layer 20. Silicon carbide layer 20 is located on first main surface 11. Silicon carbide layer 20 includes second main surface 12 opposite to surface 14 in contact with first main surface 11. Second main surface 12 is free from a stacking fault extending in a <1-100> direction from end portion 33 of lower region 41 and having a length not shorter than 1 mm.

(9) In silicon carbide single crystal substrate 10 according to any of (1) to (5), when line segment 3 which divides orientation flat 31 perpendicularly into two equal sections is divided into four equal sections when viewed in the direction perpendicular to first main surface 11, first main surface 11 may include an upper region 43 extending from an end portion 35 opposite to orientation flat 31 to a position 45 corresponding to ¼ of the line segment. Amount of warpage 101 of end region 103 continuous to end portion 35 of upper region 43 is not greater than 3 µm.

(10) Silicon carbide epitaxial substrate 100 according to the present disclosure may include silicon carbide single crystal substrate 10 described in (9) and silicon carbide layer 20. Silicon carbide layer 20 is located on first main surface 11. Silicon carbide layer 20 includes second main surface 12 opposite to surface 14 in contact with first main surface 11. Second main surface 12 is free from a stacking fault extending in a <1-100> direction from end portion 35 of upper region 43 and having a length not shorter than 1 mm.

(11) In silicon carbide single crystal substrate 10 according to any of (1) to (5), when line segment 3 which divides orientation flat 31 perpendicularly into two equal sections is divided into four equal sections when viewed in the direction perpendicular to first main surface 11, first main surface 11 may include lower region 41 extending from orientation flat 31 to position 44 corresponding to ¼ of the line segment and upper region 43 extending from end portion 35 opposite to orientation flat 31 to position 45 corresponding to ¼ of the line segment. Amount of warpage 101 of end region 103 continuous to end portion 33 of lower region 41 is not greater than 3 μm and amount of warpage 101 of end region 103 continuous to end portion 35 of upper region 43 is not greater than 3 μm.

(12) Silicon carbide epitaxial substrate 100 according to the present disclosure may include silicon carbide single crystal substrate 10 described in (11) and silicon carbide layer 20. Silicon carbide layer 20 is located on first main surface 11. Silicon carbide layer 20 includes second main surface 12 opposite to surface 14 in contact with first main surface 11. Second main surface 12 is free from a stacking fault extending in a <1-100> direction from end portion 33 of lower region 41 and having a length not shorter than 1 mm and from a stacking fault extending in the <1-100> direction from end portion 35 of upper region 43 and having a length not shorter than 1 mm.

(13) A method of manufacturing a silicon carbide semiconductor device 300 according to the present disclosure includes steps below. Silicon carbide epitaxial substrate 100 described in any of (6), (8), (10), and (12) is prepared. Silicon carbide epitaxial substrate 100 is processed.

[Details of Embodiment of the Present Disclosure]

Details of an embodiment of the present disclosure will be described below.

(Silicon Carbide Single Crystal Substrate)

Figure 2:
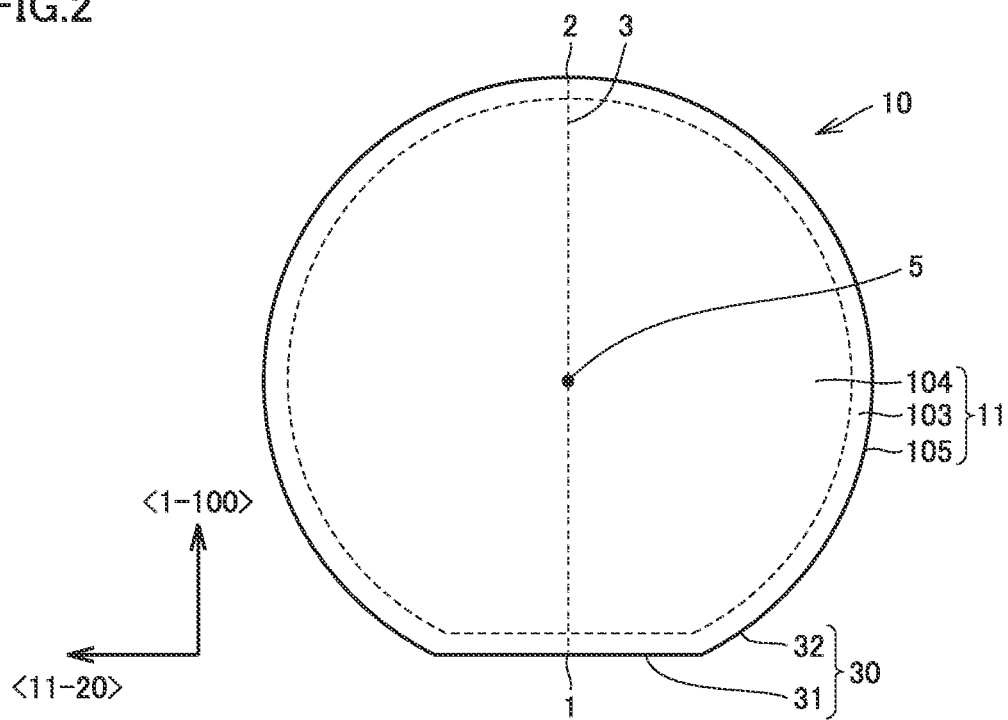
FIG. 2 is a schematic plan view showing the construction of the silicon carbide single crystal substrate according to the present embodiment.

A construction of a silicon carbide single crystal substrate according to the present embodiment will initially be described. As shown in FIGS. 1 and 2, silicon carbide single crystal substrate 10 includes first main surface 11, a third main surface 13 opposite to first main surface 11, and a side end surface 30 located between first main surface 11 and third main surface 13. Side end surface 30 is constituted of a planar orientation flat 31 and a curved curvature portion 32. Orientation flat 31 extends in a <11-20> direction. Orientation flat 31 is substantially rectangular. A longitudinal direction of orientation flat 31 is the <11-20> direction. A direction perpendicular to orientation flat 31 may be a <1-100> direction.

As shown in FIG. 2, when viewed in a direction perpendicular to first main surface 11, side end surface 30 includes linear orientation flat 31 and curvature portion 32 in an arc shape. The center of a circumcircle of a triangle formed by any three points on curvature portion 32 may be defined as center 5 of first main surface 11. Silicon carbide single crystal substrate 10 (which may be abbreviated as a "single crystal substrate" below) is made of silicon carbide single crystal. Polytype of silicon carbide single crystal is, for example, 4H-SiC. 4H-SiC is higher in other polytype in electron mobility and dielectric strength. Silicon carbide single crystal substrate 10 contains an n-type impurity such as nitrogen (N). Silicon carbide single crystal substrate 10 has, for example, an n conductivity type.

First main surface 11 is, for example, a {0001} plane or a surface inclined by at most 8° from the {0001} plane. When first main surface 11 is inclined from the {0001} plane, a direction of inclination of a normal to first main surface 11 (an off direction) is, for example, the <11-20> direction. An angle of inclination (an off angle) from the {0001} plane may be not smaller than 1° or not smaller than 2°. The off angle may be not greater than 7° or not greater than 6°. First main surface 11 has a maximum diameter (a diameter), for example, not smaller than 100 mm. The maximum diameter may be not smaller than 150 mm, not smaller than 200 mm, or not smaller than 250 mm. The upper limit of the maximum diameter is not particularly limited. The upper limit of the maximum diameter may be set, for example, to 300 mm. When first main surface 11 is located on a side of a (0001) plane, third main surface 13 is on a side of a (000-1) plane. In contrast, when first main surface 11 is on the side of the (000-1) plane, third main surface 13 is on the side of the (0001) plane. First main surface 11 includes end region 103 (a first end region) extending by at most 5 mm from outer periphery 105 of first main surface 11 toward center 5 and a central region 104 surrounded by end region 103. End region 103 is continuous to orientation flat 31.

An amount of warpage of the end region will now be described.

Figure 3:
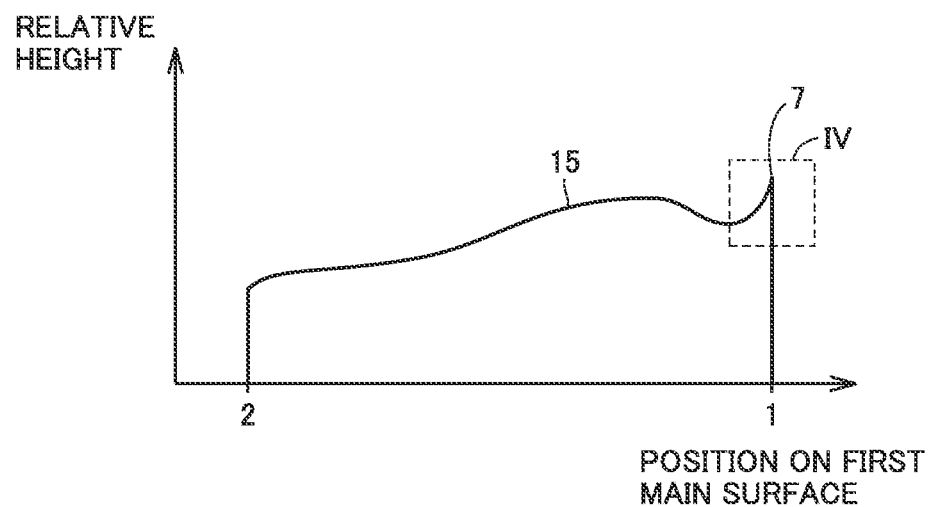
FIG. 3 is a diagram showing a first example of relation between a relative height of a first main surface and a position on the first main surface.

FIG. 3 shows cross-sectional profile 15 of first main surface 11 when a cross-section which divides orientation flat 31 perpendicularly into two equal sections when viewed in the direction perpendicular to first main surface 11 is viewed. In FIG. 3, the ordinate represents a relative height of first main surface 11 and the abscissa represents a position on the first main surface in a direction perpendicular to orientation flat 31. A method of measuring a relative height will be described later. A first position 1 refers to a position in the center of an orientation flat when viewed in the direction perpendicular to first main surface 11. A second position 2 refers to a position of curvature portion 32 opposite to first position 1 when viewed from center 5 of first main surface 11. As shown in FIG. 3, in a cross-sectional view, toward orientation flat 31, end region 103 may be warped upward in a direction away from third main surface 13 opposite to first main surface 11. A relative height of first main surface 11 may be lowest at second position 2. A relative height of first main surface 11 may gradually increase from second position 2 toward first position 1.

Figure 4:
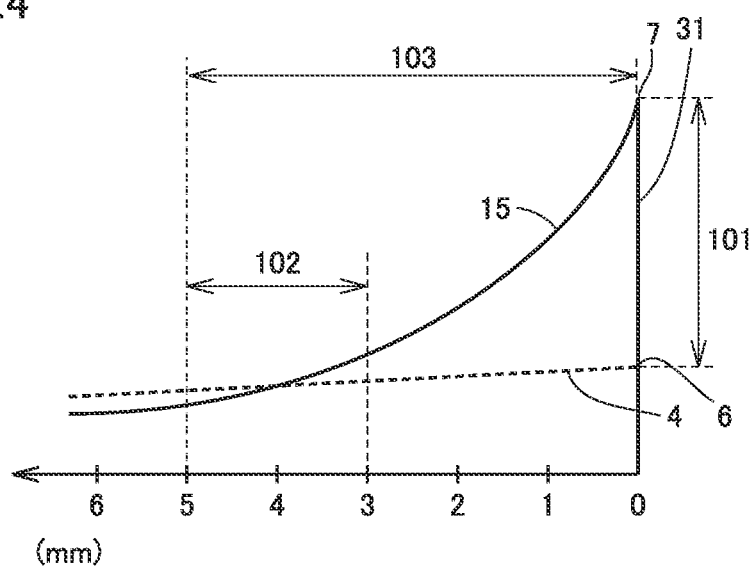
FIG. 4 is an enlarged view of a region IV in FIG. 3.

FIG. 4 is an enlarged view of a region IV in FIG. 3. The abscissa in FIG. 4 represents a distance from orientation flat 31 in the direction perpendicular to orientation flat 31. A position 0 on the abscissa refers to the position of orientation flat 31. Least square line 4 calculated from cross-sectional profile 15 of first main surface 11 in region 102 extending from a position distant by 3 mm from orientation flat 31 toward center 5 of first main surface 11 to a position distant by 5 mm therefrom is assumed. Amount of warpage 101 represents a distance between point 6 where least square line 4 intersects with orientation flat 31 and point of contact 7 between orientation flat 31 and first main surface 11. Contact point 7 may be a highest position in orientation flat 31 in the direction perpendicular to first main surface 11.

Figure 5:
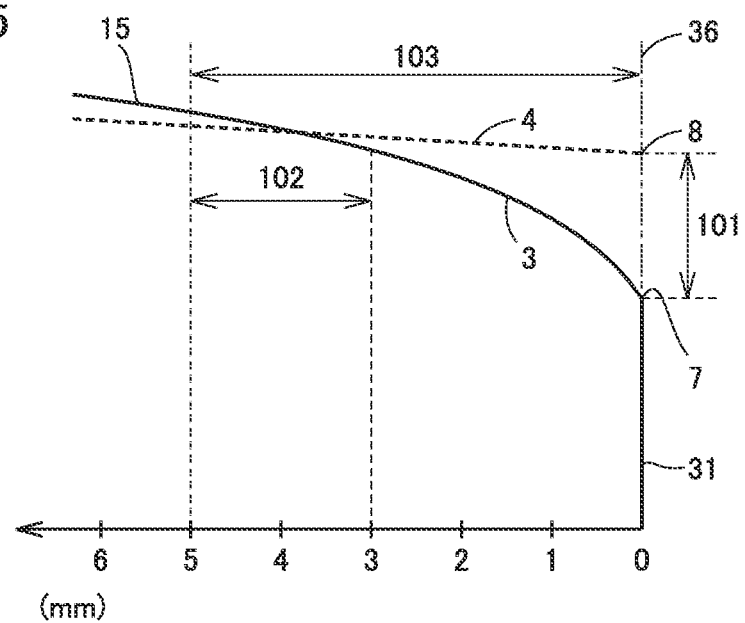
FIG. 5 is a diagram showing a second example of relation between a relative height of the first main surface and a position on the first main surface.

As shown in FIG. 5, in a cross-sectional view, toward orientation flat 31, end region 103 may be warped downward in a direction toward third main surface 13 opposite to first main surface 11. The abscissa in FIG. 5 represents a distance from orientation flat 31 in the direction perpendicular to orientation flat 31. Position 0 on the abscissa refers to the position of orientation flat 31. Least square line 4 calculated from cross-sectional profile 15 of first main surface 11 in region 102 extending from a position distant by 3 mm from orientation flat 31 toward center 5 of first main surface 11 to a position distant by 5 mm therefrom is assumed. Amount of warpage 101 represents a distance between a point 8 where least square line 4 intersects with virtual plane 36 extending along orientation flat 31 and point of contact 7 between orientation flat 31 and first main surface 11. Contact point 7 may be a lowest position in orientation flat 31 in the direction perpendicular to first main surface 11.

As set forth above, toward outer periphery 105, end region 103 may be warped upward in the direction away from third main surface 13 of silicon carbide single crystal substrate 10 or may be warped downward in the direction toward third main surface 13 on the contrary. Third main surface 13 includes a second end region extending by at most 5 mm from an outer periphery of third main surface 13. The second end region is continuous to orientation flat 31. When first end region 103 is warped upward, the second end region may be warped downward. In contrast, when first end region 103 is warped downward, the second end region may be warped upward. In the direction perpendicular to first main surface 11, amount of warpage 101 of first end region 103 is not greater than 3 μm. Amount of warpage 101 is preferably not greater than 2 μm and more preferably not greater than 1 μm. Similarly, in the direction perpendicular to third main surface 13, amount of warpage 101 of the second end region may be not greater than 3 μm, not greater than 2 μm, or not greater than 1 μm.

A method of measuring an amount of warpage will now be described.

Figure 6:
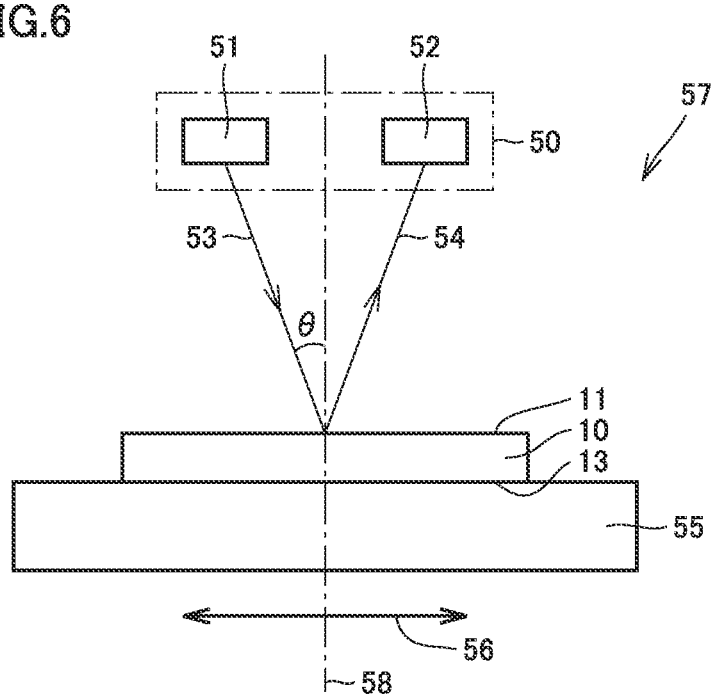
FIG. 6 is a schematic diagram showing a construction of an apparatus for measuring a relative height of the first main surface of the silicon carbide single crystal substrate.

An amount of warpage can be measured, for example, with a Dyvoce-series surface profiling system manufactured by Kohzu Precision Co., Ltd. As shown in FIG. 6, a surface profiling system 57 mainly includes, for example, a laser displacement meter 50 and an XY stage 55. Laser displacement meter 50 mainly includes a light emitting element 51 and a light receiving element 52. Light emitting element 51 is implemented, for example, by semiconductor laser.

As shown in FIG. 6, silicon carbide single crystal substrate 10 is arranged on XY stage 55. First main surface 11 of silicon carbide single crystal substrate 10 is irradiated with incident light 53 from light emitting element 51. Reflected light 54 from first main surface 11 is sensed by light receiving element 52. A distance from laser displacement meter 50 to first main surface 11 can thus be measured. By moving XY stage 55 within a two-dimensional plane, a profile of a relative height of a surface along a radial direction of first main surface 11 can be measured.

An angle θ between a straight line 58 perpendicular to first main surface 11 and a direction of incidence of incident light 53 is, for example, not smaller than 0° and not greater than 60°. When the angle is greater than 60°, noise is higher due to diffusion in particular around the outer periphery of first main surface 11 and it is difficult to accurately measure a surface profile of silicon carbide single crystal substrate 10. In the present embodiment, a surface profile around the outer periphery of first main surface 11 (in particular, a profile around a tangent 7 between first main surface 11 and side end surface 30) can accurately be measured by setting the angle to be smaller.

For example, a relative height of first main surface 11 is measured along line segment 3 in FIG. 2. Then, silicon carbide single crystal substrate 10 is shifted by 10 mm, for example, in the <11-20> direction with the use of XY stage 55. Then, a relative height of first main surface 11 is measured along a line segment in parallel to line segment 3. As set forth above, a profile of a relative height of first main surface 11 is measured at a 10-mm interval.

Amount of warpage 101 of end region 103 continuous to orientation flat 31 being not greater than 3 μm means that amount of warpage 101 of end region 103 at all measurement positions is not greater than 3 μm when amount of warpage 101 of end region 103 is measured at measurement positions at the 10-mm interval in a direction of extension of orientation flat 31 (that is, the <11-20> direction) when viewed in the direction perpendicular to first main surface 11.

(Silicon Carbide Epitaxial Substrate)

Figure 7:
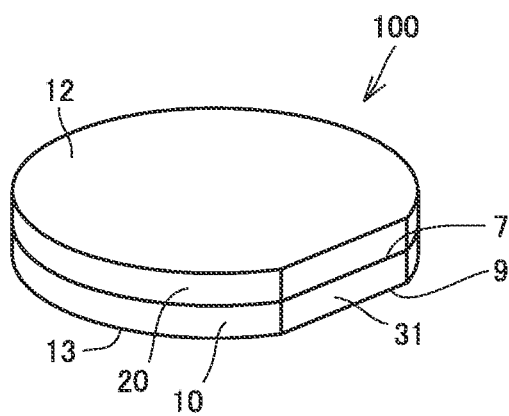
FIG. 7 is a schematic perspective view showing a construction of a silicon carbide epitaxial substrate according to the present embodiment.

A construction of a silicon carbide epitaxial substrate according to the present embodiment will now be described. As shown in FIG. 7, silicon carbide epitaxial substrate 100 includes silicon carbide single crystal substrate 10 and silicon carbide layer 20. Silicon carbide layer 20 is located on first main surface 11. Silicon carbide layer 20 includes a fourth main surface 14 in contact with first main surface 11 and second main surface 12 opposite to fourth main surface 14. Second main surface 12 is free from a stacking fault which extends in the <1-100> direction from orientation flat 31 and has a length not shorter than 1 mm. The second main surface is preferably free from a stacking fault which has a length not shorter than 1.5 mm and more preferably free from a stacking fault which has a length not shorter than 2 mm. A length of a stacking fault is defined as a length in the <1-100> direction. Second main surface 12 may include a stacking fault which extends from a region different from orientation flat 31, a stacking fault which extends in a direction different from the <1-100> direction, or a stacking fault having a length shorter than 1 mm.

Silicon carbide layer 20 is an epitaxial layer formed through epitaxial growth. Silicon carbide layer 20 contains an n-type impurity such as nitrogen. A concentration of the n-type impurity contained in silicon carbide layer 20 may be lower than a concentration of an n-type impurity contained in silicon carbide single crystal substrate 10. Silicon carbide layer 20 defines second main surface 12. Silicon carbide layer 20 may have a thickness, for example, not smaller than 5 μm, not smaller than 10 μm, or not smaller than 15 μm.

(Method of Observing Stacking Fault)

A method of observing a stacking fault will now be described. For example, a photoluminescence imaging apparatus manufactured by Photon Design Corporation is used for observation of a stacking fault. When second main surface 12 of silicon carbide epitaxial substrate 100 is irradiated with excitation light, photoluminescence is observed in second main surface 12. For example, white light is employed as excitation light. White light passes, for example, through a 313-nm band pass filter and is emitted to second main surface 12. Photoluminescence passes, for example, through a 740-nm low pass filter and thereafter reaches a light receiving element such as a camera. As set forth above, a photoluminescence image of a measurement region on second main surface 12 is shot.

For example, by shooting a photoluminescence image of second main surface 12 while silicon carbide epitaxial substrate 100 is moved in a direction in parallel to second main surface 12, the photoluminescence image over the entire second main surface 12 is mapped. White streaks which linearly extend from orientation flat 31 are identified as a stacking fault in the photoluminescence image.

(First Modification of Silicon Carbide Single Crystal Substrate)

Figure 8:
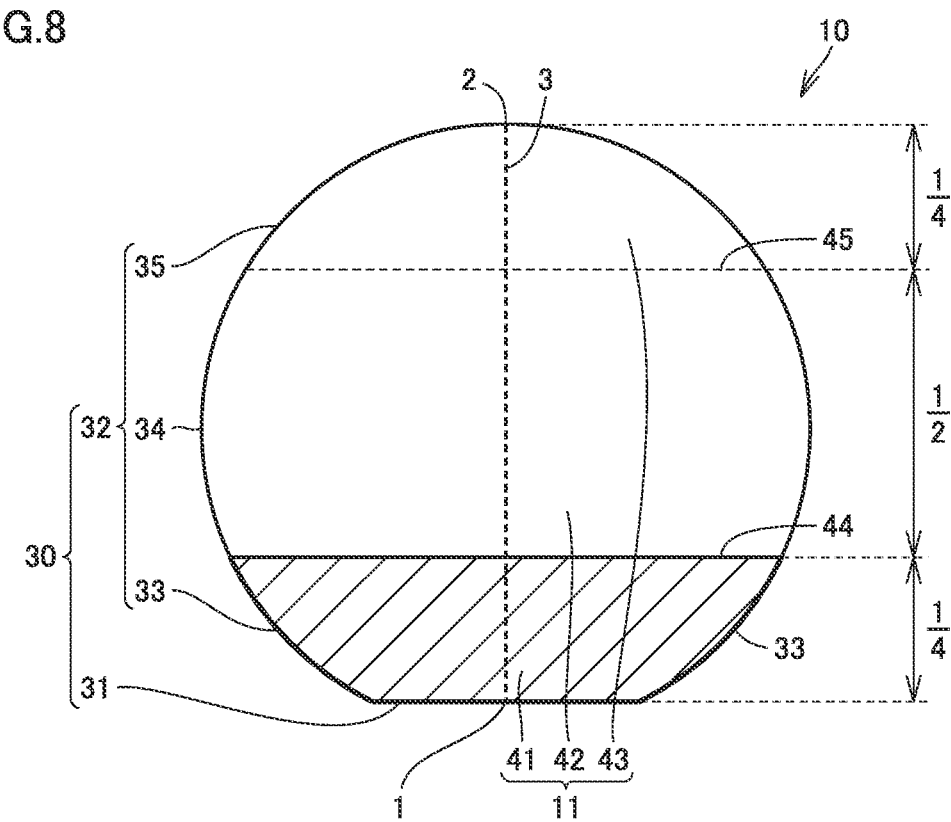
FIG. 8 is a schematic plan view showing a construction of a first modification of the silicon carbide single crystal substrate according to the present embodiment.

As shown in FIG. 8, an example in which line segment 3 which divides orientation flat 31 perpendicularly into two equal sections is divided into four equal sections in silicon carbide single crystal substrate 10 when viewed in the direction perpendicular to first main surface 11 is assumed. First main surface 11 includes lower region 41 extending from orientation flat 31 to position 44 corresponding to ¼ of line segment 3. Line segment 3 is located on first main surface 11. Line segment 3 passes through center 5 of first main surface 11. Position 44 defines a line segment perpendicular to line segment 3. Position 44 is located at a position distant by a length corresponding to ¼ of line segment 3 from first position 1 representing a point of contact between line segment 3 and orientation flat 31 when line segment 3 is divided into four equal sections.

When viewed in the direction perpendicular to first main surface 11, curvature portion 32 in an arc shape includes a lower arc portion 33, a central arc portion 34, and an upper arc portion 35. Central arc portion 34 is located between lower arc portion 33 and upper arc portion 35. Lower arc portion 33 is defined by lower region 41. Amount of warpage 101 of end region 103 continuous to end portion 33 of lower region 41 is not greater than 3 μm. Amount of warpage 101 of end region 103 being not greater than 3 μm means that amount of warpage 101 of end region 103 at all measurement positions is not greater than 3 μm when amount of warpage 101 of end region 103 is measured at measurement positions at the 10-mm interval in a direction along end portion 33 when viewed in the direction perpendicular to first main surface 11. Amount of warpage 101 of end region 103 is preferably not greater than 2 μm and more preferably not greater than 1 μm.

(First Modification of Silicon Carbide Epitaxial Substrate)

As shown in FIG. 7, silicon carbide epitaxial substrate 100 according to a first modification includes silicon carbide single crystal substrate 10 according to the first modification and silicon carbide layer 20. Silicon carbide layer 20 is located on first main surface 11. Silicon carbide layer 20 includes fourth main surface 14 in contact with first main surface 11 and second main surface 12 opposite to fourth main surface 14. Second main surface 12 is free from a stacking fault which extends in the <1-100> direction from end portion 33 of lower region 41 and has a length not shorter than 1 mm. Second main surface 12 may include a stacking fault which extends from a region different from end portion 33 of lower region 41, a stacking fault which extends in a direction different from the <1-100> direction, or a stacking fault having a length shorter than 1 mm.

(Second Modification of Silicon Carbide Single Crystal Substrate)

Figure 9:
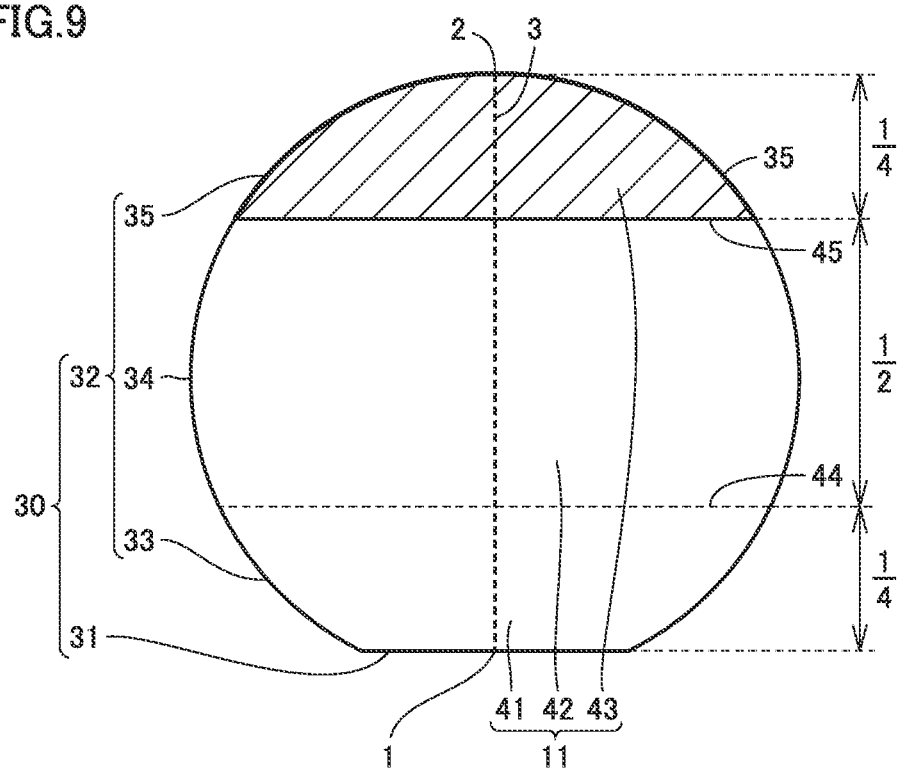
FIG. 9 is a schematic plan view showing a construction of a second modification of the silicon carbide single crystal substrate according to the present embodiment.

As shown in FIG. 9, an example in which line segment 3 which divides orientation flat 31 perpendicularly into two equal sections is divided into four equal sections in silicon carbide single crystal substrate 10 according to a second modification when viewed in the direction perpendicular to first main surface 11 is assumed. First main surface 11 includes upper region 43 extending from end portion 35 opposite to orientation flat 31 to position 45 corresponding to ¼ of the line segment. Line segment 3 is located on first main surface 11. Line segment 3 passes through center 5 of first main surface 11. Position 45 defines a line segment perpendicular to line segment 3. Position 45 is located at a position distant by a length corresponding to ¼ of line segment 3 from second position 2 representing a point of contact between line segment 3 and end portion 35 when line segment 3 is divided into four equal sections.

When viewed in the direction perpendicular to first main surface 11, curvature portion 32 in an arc shape includes lower arc portion 33, central arc portion 34, and upper arc portion 35. Central arc portion 34 is located between lower arc portion 33 and upper arc portion 35. Upper arc portion 35 is defined by upper region 43. Amount of warpage 101 of end region 103 continuous to end portion 35 of upper region 43 is not greater than 3 μm. Amount of warpage 101 of end region 103 continuous to end portion 35 of upper region 43 being not greater than 3 μm means that amount of warpage 101 of end region 103 at all measurement positions is not greater than 3 μm when amount of warpage 101 of end region 103 is measured at measurement positions at the 10-mm interval in a direction along end portion 35 when viewed in the direction perpendicular to first main surface 11. Amount of warpage 101 of end region 103 is preferably not greater than 2 μm and more preferably not greater than 1 μm.

(Second Modification of Silicon Carbide Epitaxial Substrate)

As shown in FIG. 7, silicon carbide epitaxial substrate 100 according to a second modification includes silicon carbide single crystal substrate 10 according to the second modification and silicon carbide layer 20. Silicon carbide layer 20 is located on first main surface 11. Silicon carbide layer 20 includes second main surface 12 opposite to surface 14 in contact with first main surface 11. Second main surface 12 is free from a stacking fault which extends in the <1-100> direction from end portion 35 of upper region 43 and has a length not shorter than 1 mm. Second main surface 12 may include a stacking fault which extends from a region different from end portion 35 of upper region 43, a stacking fault which extends in a direction different from the <1-100> direction, or a stacking fault having a length shorter than 1 mm.

(Third Modification of Silicon Carbide Single Crystal Substrate)

Figure 10:
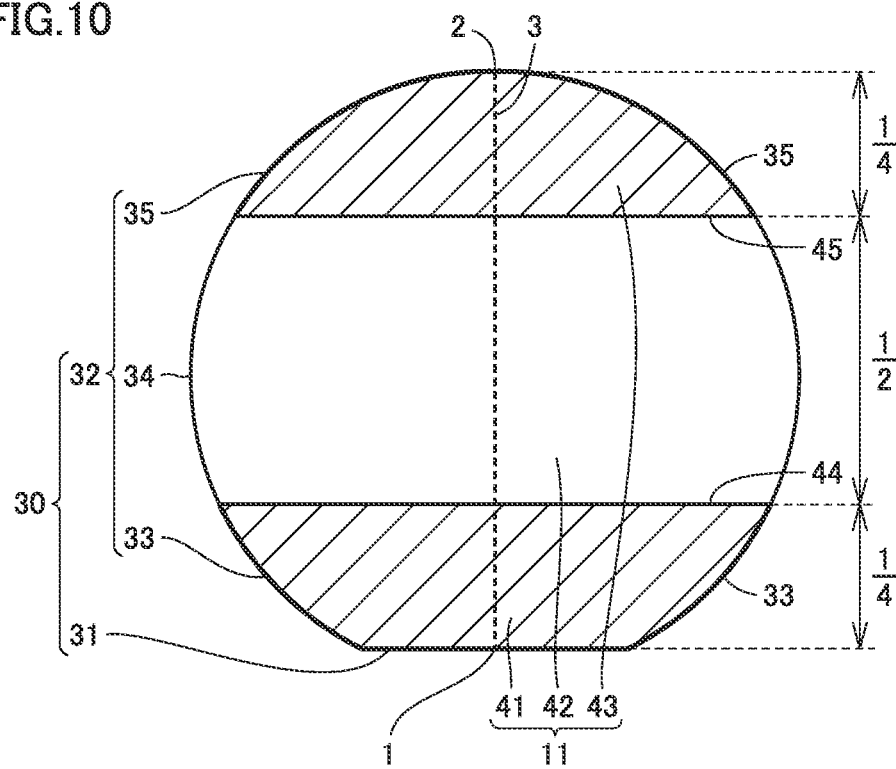
FIG. 10 is a schematic plan view showing a construction of a third modification of the silicon carbide single crystal substrate according to the present embodiment.

As shown in FIG. 10, an example in which line segment 3 which divides orientation flat 31 perpendicularly into two equal sections is divided into four equal sections in silicon carbide single crystal substrate 10 according to a third modification when viewed in the direction perpendicular to first main surface 11 is assumed. First main surface 11 includes lower region 41 extending from orientation flat 31 to position 44 corresponding to ¼ of the line segment and upper region 43 extending from end portion 35 opposite to orientation flat 31 to position 45 corresponding to ¼ of the line segment. Line segment 3 is located on first main surface 11. Line segment 3 passes through center 5 of first main surface 11. Position 44 defines a line segment perpendicular to line segment 3. Position 44 is located at a position distant by a length corresponding to ¼ of line segment 3 from first position 1 representing the point of contact between line segment 3 and orientation flat 31 when line segment 3 is divided into four equal sections. Position 45 is located at a position distant by a length corresponding to ¼ of line segment 3 from second position 2 representing the point of contact between line segment 3 and end portion 35 when line segment 3 is divided into four equal sections.

When viewed in the direction perpendicular to first main surface 11, curvature portion 32 in an arc shape includes lower arc portion 33, central arc portion 34, and upper arc portion 35. Central arc portion 34 is located between lower arc portion 33 and upper arc portion 35. Upper arc portion 35 is defined by upper region 43. Lower arc portion 33 is defined by lower region 41.

Amount of warpage 101 of end region 103 continuous to end portion 33 of lower region 41 is not greater than 3 μm. Amount of warpage 101 of end region 103 continuous to end portion 33 of lower region 41 being not greater than 3 μm means that amount of warpage 101 of end region 103 at all measurement positions is not greater than 3 μm when amount of warpage 101 of end region 103 is measured at measurement positions at the 10-mm interval in a direction along end portion 33 when viewed in the direction perpendicular to first main surface 11. Amount of warpage 101 of end region 103 is preferably not greater than 2 μm and more preferably not greater than 1 μm.

Amount of warpage 101 of end region 103 continuous to end portion 35 of upper region 43 is not greater than 3 μm. Amount of warpage 101 of end region 103 continuous to end portion 35 of upper region 43 being not greater than 3 μm means that amount of warpage 101 of end region 103 at all measurement positions is not greater than 3 μm when amount of warpage 101 of end region 103 is measured at measurement positions at the 10-mm interval in a direction along end portion 35 when viewed in the direction perpendicular to first main surface 11. Amount of warpage 101 of end region 103 is preferably not greater than 2 μm and more preferably not greater than 1 μm.

(Third Modification of Silicon Carbide Epitaxial Substrate)

As shown in FIG. 7, silicon carbide epitaxial substrate 100 according to a third modification includes silicon carbide single crystal substrate 10 according to the third modification and silicon carbide layer 20. Silicon carbide layer 20 is located on first main surface 11. Silicon carbide layer 20 includes second main surface 12 opposite to surface 14 in contact with first main surface 11. Second main surface 12 is free from a stacking fault which extends in the <1-100> direction from end portion 33 of lower region 41 and has a length not shorter than 1 mm and free from a stacking fault which extends in the <1-100> direction from end portion 35 of upper region 43 and has a length not shorter than 1 mm. Second main surface 12 may include a stacking fault which extends from a region different from end portion 35 of upper region 43 and end portion 33 of lower region 41, a stacking fault which extends in a direction different from the <1-100> direction, or a stacking fault having a length shorter than 1 mm.

(Method of Manufacturing Silicon Carbide Single Crystal Substrate)

A method of manufacturing a silicon carbide single crystal substrate according to the present embodiment will now be described.

Figure 11:
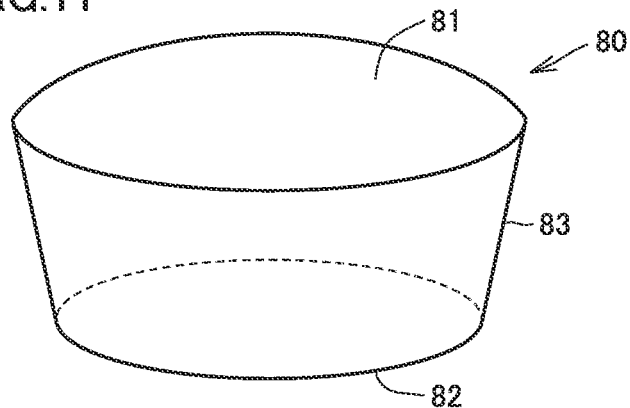
FIG. 11 is a schematic perspective view showing a first step of a method of manufacturing a silicon carbide single crystal substrate according to the present embodiment.
Figure 12:
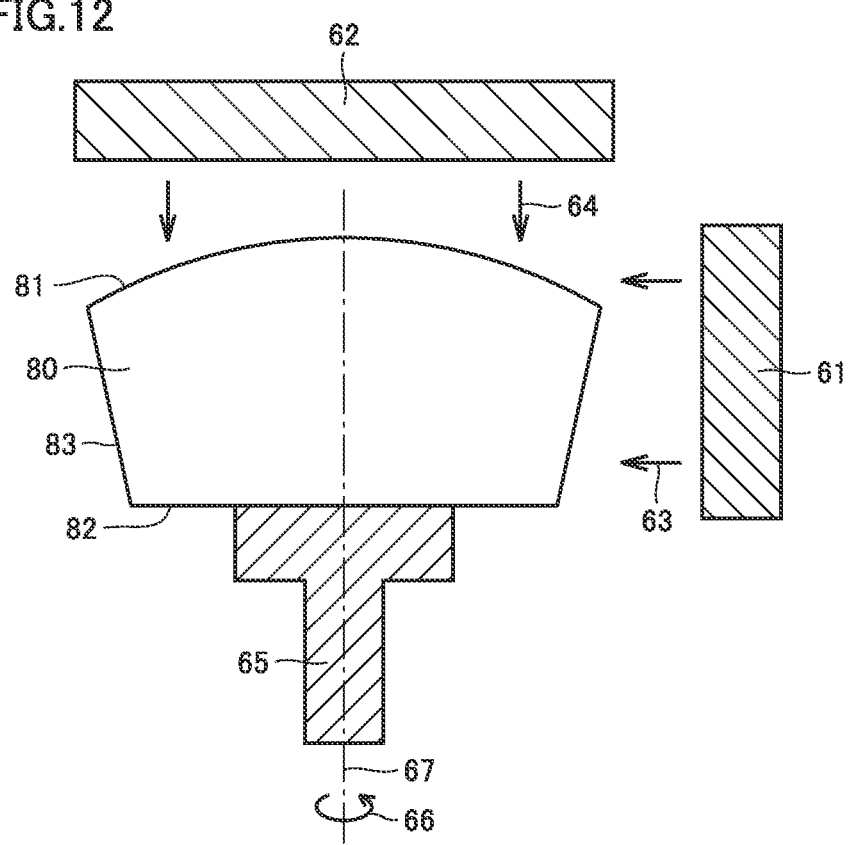
FIG. 12 is a schematic cross-sectional view showing a second step of the method of manufacturing a silicon carbide single crystal substrate according to the present embodiment.

A silicon carbide single crystal ingot 80 of polytype 4H is manufactured, for example, with a sublimation method. As shown in FIG. 11, silicon carbide single crystal ingot 80 includes an upper surface 81, a lower surface 82, and a side surface 83. Side surface 83 is located between upper surface 81 and lower surface 82. Side surface 83 is provided continuously to upper surface 81 and provided continuously to lower surface 82. Upper surface 81 is, for example, convexly curved. Lower surface 82 is, for example, substantially planar and substantially annular. In a cross-sectional view, side surface 83 has a width increasing from lower surface 82 toward upper surface 81. When silicon carbide single crystal is manufactured with the sublimation method with the use of a crucible, upper surface 81 faces a silicon carbide source material and lower surface 82 faces a seed substrate.

Figure 13:
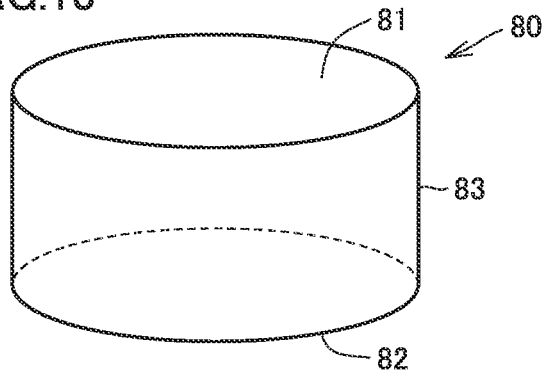
FIG. 13 is a schematic perspective view showing a third step of the method of manufacturing a silicon carbide single crystal substrate according to the present embodiment.
Figure 14:
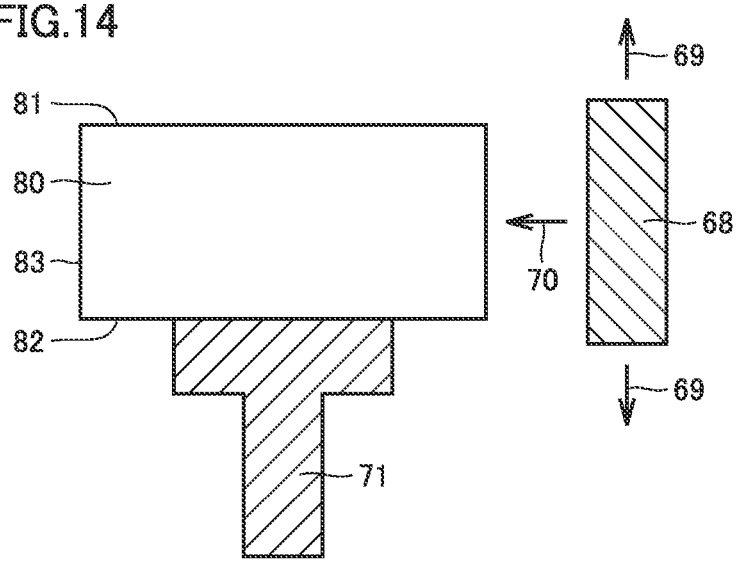
FIG. 14 is a schematic cross-sectional view showing a fourth step of the method of manufacturing a silicon carbide single crystal substrate according to the present embodiment.

Silicon carbide single crystal ingot 80 is then shaped. Specifically, a first grindstone 61 and a second grindstone 62 are prepared. First grindstone 61 is arranged to face side surface 83. Second grindstone 62 is arranged to face upper surface 81. Lower surface 82 of silicon carbide single crystal ingot 80 is fixed to a holder 65. Holder 65 is made, for example, of stainless steel. By rotating holder 65 around an axis of rotation 67, silicon carbide single crystal ingot 80 fixed to holder 65 is rotated. As first grindstone 61 is pressed against side surface 83 of silicon carbide single crystal ingot 80 while silicon carbide single crystal ingot 80 is rotated, side surface 83 is ground. Similarly, as second grindstone 62 is pressed against upper surface 81 of silicon carbide single crystal ingot 80 while silicon carbide single crystal ingot 80 is rotated, upper surface 81 is ground. Silicon carbide single crystal ingot 80 is thus formed into a substantially columnar shape (see FIG. 13). Silicon carbide single crystal ingot 80 has substantially annular upper surface 81, substantially annular lower surface 82, and substantially cylindrical side surface 83. Holder 65 is removed from lower surface 82 of silicon carbide single crystal ingot 80.

Figure 15:
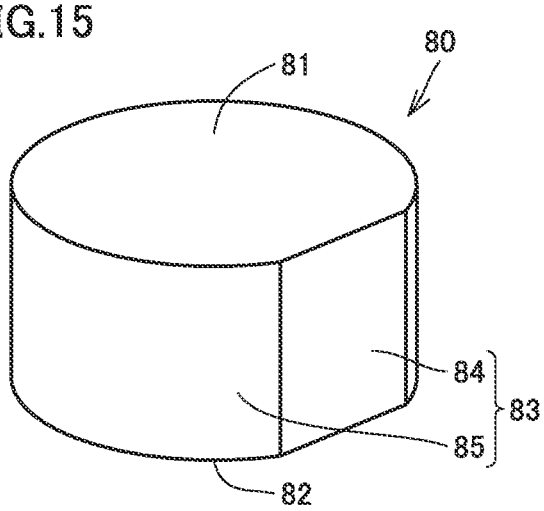
FIG. 15 is a schematic perspective view showing a fifth step of the method of manufacturing a silicon carbide single crystal substrate according to the present embodiment.

Then, a holder 71 is attached to lower surface 82 of silicon carbide single crystal ingot 80. While silicon carbide single crystal ingot 80 is fixed to holder 71 at rest, a third grindstone 68 is pressed against side surface 83 of silicon carbide single crystal ingot 80. As third grindstone 68 is pressed against in a direction 70 shown with an arrow while it carries out reciprocating motion along a direction 69 in parallel to side surface 83, side surface 83 is ground. An orientation flat 84 is thus formed in silicon carbide single crystal ingot 80 (see FIG. 15). Side surface 83 is defined by planar orientation flat 84 and a curved surface portion 85. Orientation flat 84 is substantially rectangular.

Then, a protection portion 92 is attached to orientation flat 84. Protection portion 92 is provided to cover the entire planar orientation flat 84 (see FIG. 16). Protection portion 92 is fixed to orientation flat 84, for example, with an adhesive. Though a shape of protection portion 92 is not particularly limited, it is, for example, in a form of a plate. For example, silicon carbide is employed as a material for protection portion 92. Protection portion 92 may be composed of single crystal silicon carbide or polycrystalline silicon carbide. Protection portion 92 in a form of a plate has a thickness, for example, not smaller than 10 mm.

Figure 16:
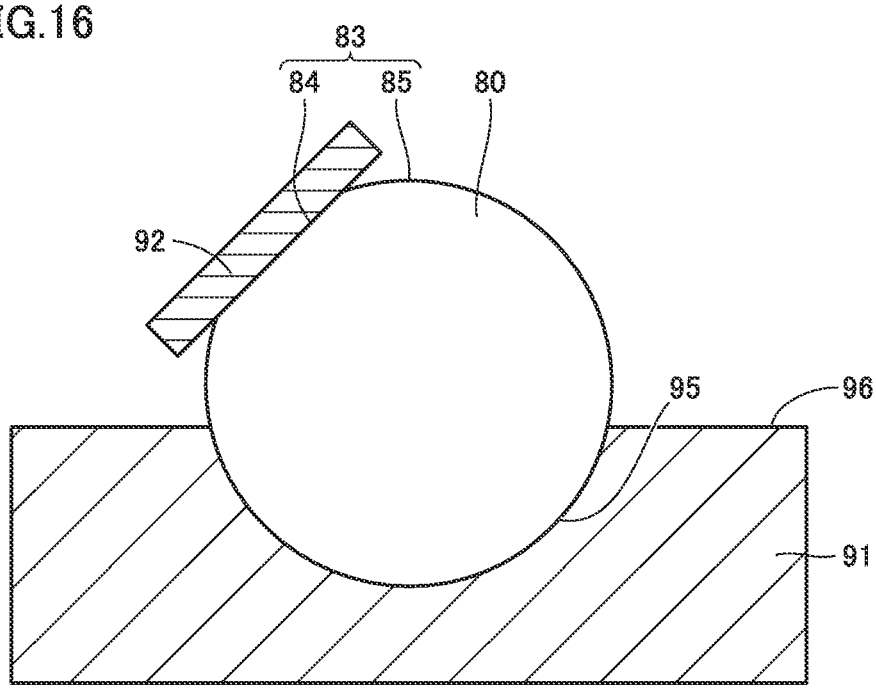
FIG. 16 is a schematic cross-sectional view showing a sixth step of the method of manufacturing a silicon carbide single crystal substrate according to the present embodiment.

As shown in FIG. 16, silicon carbide single crystal ingot 80 is held on a base 91 while orientation flat 84 is covered with protection portion 92. A surface 96 of base 91 is provided with a recess 95 in an arc shape. Curved surface portion 85 of side surface 83 of silicon carbide single crystal ingot 80 is arranged in recess 95. Silicon carbide single crystal ingot 80 is fixed to base 91, for example, with an adhesive. Orientation flat 84 of silicon carbide single crystal ingot 80 is inclined with respect to surface 96 of base 91. Protection portion 92 may be distant from surface 96.

Figure 17:
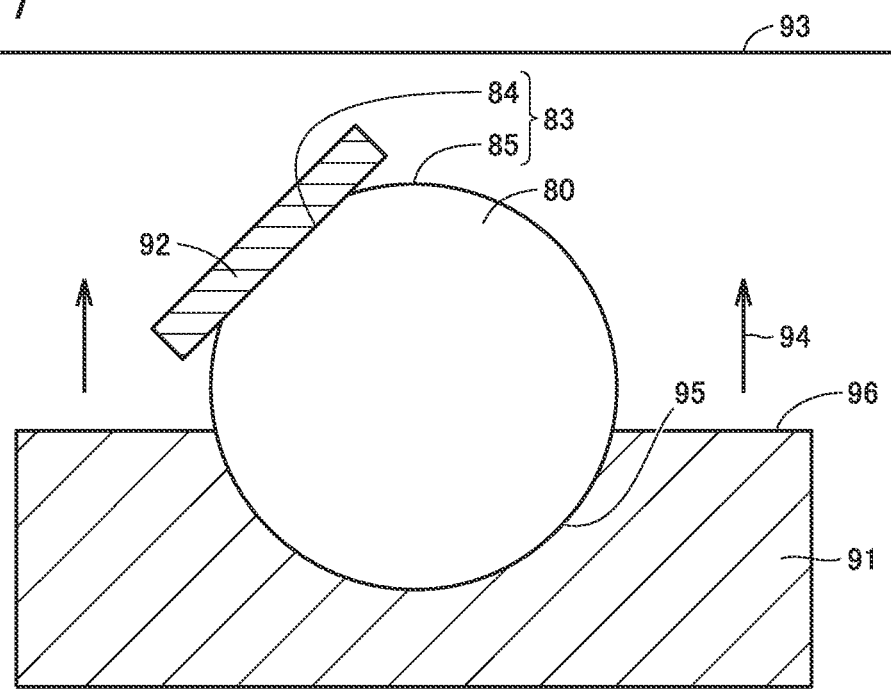
FIG. 17 is a schematic cross-sectional view showing a seventh step of the method of manufacturing a silicon carbide single crystal substrate according to the present embodiment.

Silicon carbide single crystal ingot 80 is then cut. As shown in FIG. 17, a wire saw 93 is arranged on a side opposite to base 91 when viewed from silicon carbide single crystal ingot 80. As base 91 moves in a direction 94 shown with an arrow while wire saw 93 swings, silicon carbide single crystal ingot 80 is cut with wire saw 93. A plurality of wire saws 93 may be aligned in a direction perpendicular to upper surface 81. Wire saw 93 comes in contact with protection portion 92 before it comes in contact with silicon carbide single crystal ingot 80. After a part of protection portion 92 is cut, wire saw 93 starts to cut silicon carbide single crystal ingot 80.

In cutting silicon carbide single crystal ingot 80 with wire saw 93, ideally, wire saw 93 is substantially perpendicularly introduced into side surface 83 of silicon carbide single crystal ingot 80. At the time of start of cutting, however, an angle of introduction of wire saw 93 into side surface 83 of silicon carbide single crystal ingot 80 is not stable and wire saw 93 may obliquely be introduced into side surface 83. When cutting of silicon carbide single crystal ingot 80 with wire saw 93 is started without using protection portion 92, wire saw 93 tends to be introduced obliquely to side surface 83.

In the present embodiment, protection portion 92 covers the entire surface of orientation flat 84. Though a cut surface of protection portion 92 which is cut first may be curved with respect to the side surface of protection portion 92, the cut surface will gradually be substantially perpendicular to the side surface. Therefore, silicon carbide single crystal ingot 80 cut in succession to protection portion 92 is cut substantially perpendicularly to side surface 83 of silicon carbide single crystal ingot 80. Consequently, amount of warpage 101 of end region 103 continuous to orientation flat 31 can be reduced (see FIG. 4). Silicon carbide single crystal substrate 10 (see FIG. 1) is prepared as above.

(Method of Manufacturing Silicon Carbide Epitaxial Substrate)

A method of manufacturing a silicon carbide epitaxial substrate will now be described. Silicon carbide layer 20 is formed on silicon carbide single crystal substrate 10 through epitaxial growth, for example, through hot-wall chemical vapor deposition (CVD). Specifically, silicon carbide single crystal substrate 10 is arranged in a CVD reaction chamber. For example, after a pressure in the reaction chamber is lowered from the atmospheric pressure to approximately $1 \times 10^{-6}$ Pa, increase in temperature of silicon carbide single crystal substrate 10 is started. During temperature increase, hydrogen ($H_2$) gas representing carrier gas is introduced into the reaction chamber.

After a temperature in the reaction chamber reaches, for example, approximately 1600° C., source gas and doping gas are introduced into the reaction chamber. The source gas includes Si source gas and C source gas. For example, silane ($SiH_4$) gas can be used as the Si source gas. For example, propane ($C_3H_8$) gas can be used as the C source gas. Flow rates of the silane gas and the propane gas are set, for example, to 46 sccm and 14 sccm, respectively. A volume ratio of the silane gas to hydrogen is set, for example, to 0.04%. A C/Si ratio of the source gas is set, for example, to 0.9.

Figure 18:
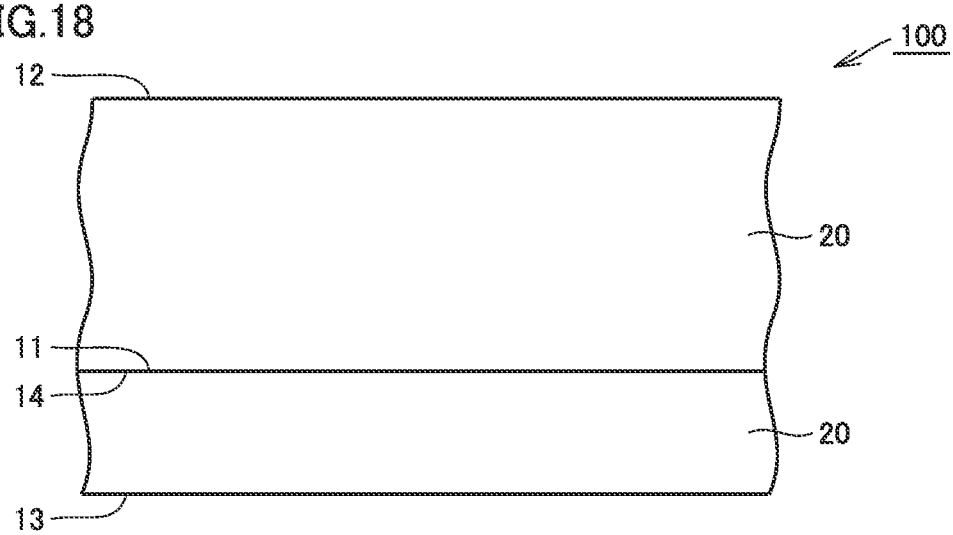
FIG. 18 is a schematic cross-sectional view showing a method of manufacturing a silicon carbide epitaxial substrate according to the present embodiment.

For example, ammonia ($NH_3$) gas is used as the doping gas. The ammonia gas is thermally decomposed more easily than nitrogen gas having triple bond. By using the ammonia gas, improvement in in-plane uniformity of a concentration of carriers can be expected. A concentration of the ammonia gas with respect to the hydrogen gas is set, for example, to 1 ppm. By introducing the carrier gas, the source gas, and the doping gas into the reaction chamber while silicon carbide single crystal substrate 10 is heated to approximately 1600° C., silicon carbide layer 20 is formed on silicon carbide single crystal substrate 10 through epitaxial growth (see FIGS. 7 and 18). Silicon carbide epitaxial substrate 100 including silicon carbide single crystal substrate 10 and silicon carbide layer 20 is thus manufactured.

(Method of Manufacturing Silicon Carbide Semiconductor Device)

A method of manufacturing silicon carbide semiconductor device 300 according to the present embodiment will now be described.

Figure 19:
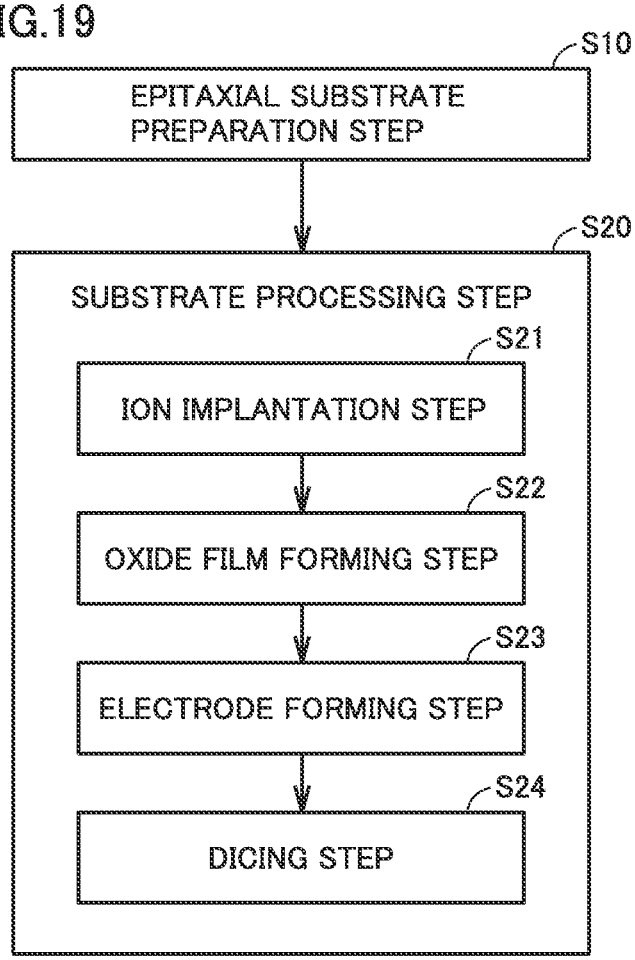
FIG. 19 is a flowchart schematically showing a method of manufacturing a silicon carbide semiconductor device according to the present embodiment.

The method of manufacturing a silicon carbide semiconductor device according to the present embodiment mainly includes an epitaxial substrate preparation step (S10: FIG. 19) and a substrate processing step (S20: FIG. 19).

Initially, the epitaxial substrate preparation step (S10: FIG. 19) is performed. Specifically, with the method of manufacturing a silicon carbide epitaxial substrate described previously, silicon carbide epitaxial substrate 100 is prepared (see FIGS. 7 and 18).

Then, the substrate processing step (S20: FIG. 19) is performed. Specifically, a silicon carbide semiconductor device is manufactured by processing the silicon carbide epitaxial substrate. "Processing" includes various types of processing such as ion implantation, heat treatment, etching, formation of an oxide film, formation of an electrode, and dicing. The substrate processing step may include at least any processing of ion implantation, heat treatment, etching, formation of an oxide film, formation of an electrode, and dicing.

A method of manufacturing a metal oxide semiconductor field effect transistor (MOSFET) representing one example of a silicon carbide semiconductor device will be described below. The substrate processing step (S20: FIG. 19) includes an ion implantation step (S21: FIG. 19), an oxide film forming step (S22: FIG. 19), an electrode forming step (S23: FIG. 19), and a dicing step (S24: FIG. 19).

Figure 20:
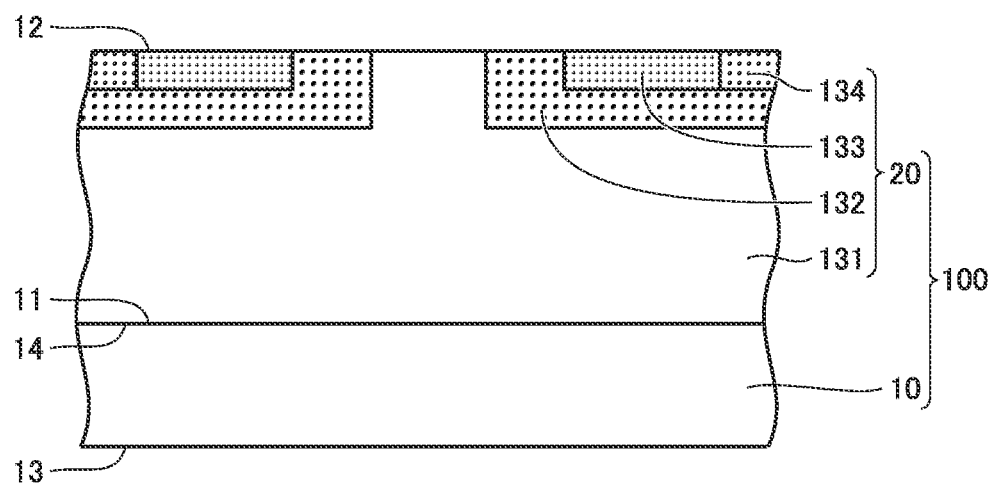
FIG. 20 is a schematic cross-sectional view showing a first step of the method of manufacturing a silicon carbide semiconductor device according to the present embodiment.

Initially, the ion implantation step (S21: FIG. 19) is performed. A p-type impurity such as aluminum (Al) is implanted into second main surface 12 where a mask (not shown) provided with an opening is formed. A body region 132 having the p conductivity type is thus formed. Then, an n-type impurity such as phosphorus (P) is implanted into a prescribed position in body region 132. A source region 133 having the n conductivity type is thus formed. Then, a p-type impurity such as aluminum is implanted into a prescribed position in source region 133. A contact region 134 having the p conductivity type is thus formed (see FIG. 20).

A portion in silicon carbide layer 20 other than body region 132, source region 133, and contact region 134 is a drift region 131. Source region 133 is spaced away from drift region 131 by body region 132. Ions may be implanted by heating silicon carbide epitaxial substrate 100 to a temperature approximately not lower than 300° C. and not higher than 600° C. After ion implantation, silicon carbide epitaxial substrate 100 is subjected to activation annealing. The impurities implanted in silicon carbide layer 20 are activated through activation annealing so that carriers are generated in each region. An atmosphere for activation annealing may be, for example, an argon (Ar) atmosphere. A temperature for activation annealing may be set, for example, to approximately 1800° C. A time period for activation annealing may be set, for example, to approximately 30 minutes.

Figure 21:
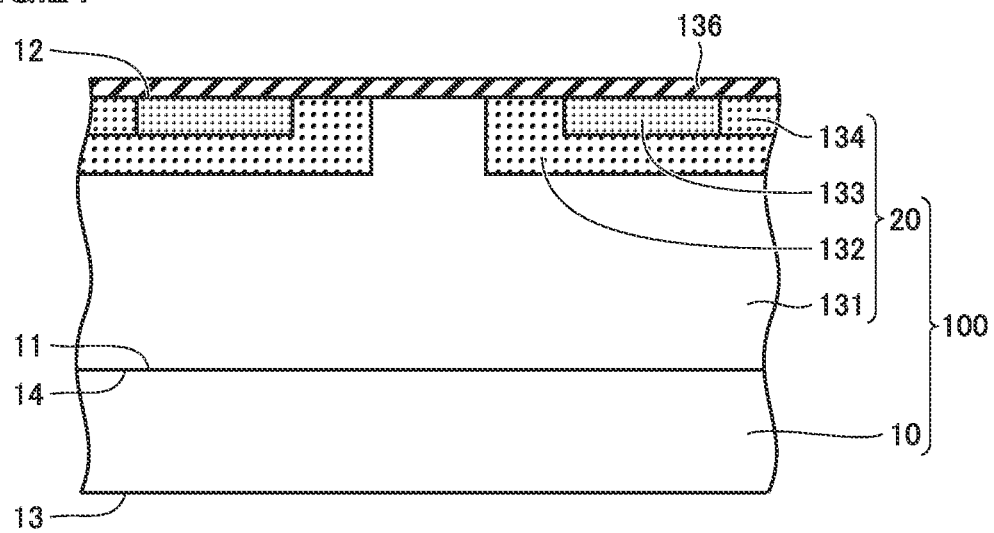
FIG. 21 is a schematic cross-sectional view showing a second step of the method of manufacturing a silicon carbide semiconductor device according to the present embodiment.

Then, the oxide film forming step (S22: FIG. 19) is performed. For example, as silicon carbide epitaxial substrate 100 is heated in an atmosphere containing oxygen, an oxide film 136 is formed on second main surface 12 (see FIG. 21). Oxide film 136 is composed, for example, of silicon dioxide ($SiO_2$). Oxide film 136 functions as a gate insulating film. A temperature for thermal oxidation treatment may be set, for example, to approximately 1300° C. A time period for thermal oxidation treatment may be set, for example, to approximately 30 minutes.

After oxide film 136 is formed, heat treatment may further be performed in a nitrogen atmosphere. For example, heat treatment may be performed approximately for one hour at approximately 1100° C. in a nitric oxide (NO) or nitrous oxide ($N_2O$) atmosphere. Further thereafter, heat treatment may be performed in the argon atmosphere. For example, heat treatment may be performed in the argon atmosphere for approximately one hour at a temperature approximately from 1100 to 1500° C.

Then, the electrode forming step (S23: FIG. 19) is performed. A first electrode 141 is formed on oxide film 136. First electrode 141 functions as a gate electrode. First electrode 141 is formed, for example, with CVD. First electrode 141 is composed, for example, of polysilicon which is conductive by containing an impurity. First electrode 141 is formed at a position where it faces source region 133 and body region 132.

Then, an interlayer insulating film 137 which covers first electrode 141 is formed. Interlayer insulating film 137 is formed, for example, with CVD. Interlayer insulating film 137 is composed, for example, of silicon dioxide. Interlayer insulating film 137 is formed as being in contact with first electrode 141 and oxide film 136. Then, oxide film 136 and interlayer insulating film 137 at a prescribed position are etched away. Source region 133 and contact region 134 are thus exposed through oxide film 136.

A second electrode 142 is formed in that exposed portion, for example, with sputtering. Second electrode 142 functions as a source electrode. Second electrode 142 is composed, for example, of titanium, aluminum, and silicon. After second electrode 142 is formed, second electrode 142 and silicon carbide epitaxial substrate 100 are heated at a temperature, for example, approximately from 900 to 1100° C. Second electrode 142 and silicon carbide epitaxial substrate 100 are thus brought in ohmic contact with each other. Then, an interconnection layer 138 is formed as being in contact with second electrode 142. Interconnection layer 138 is composed of a material containing, for example, aluminum.

Then, a third electrode 143 is formed on third main surface 13. Third electrode 143 functions as a drain electrode. Third electrode 143 is composed, for example, of an alloy containing nickel and silicon (for example, NiSi).

Figure 22:
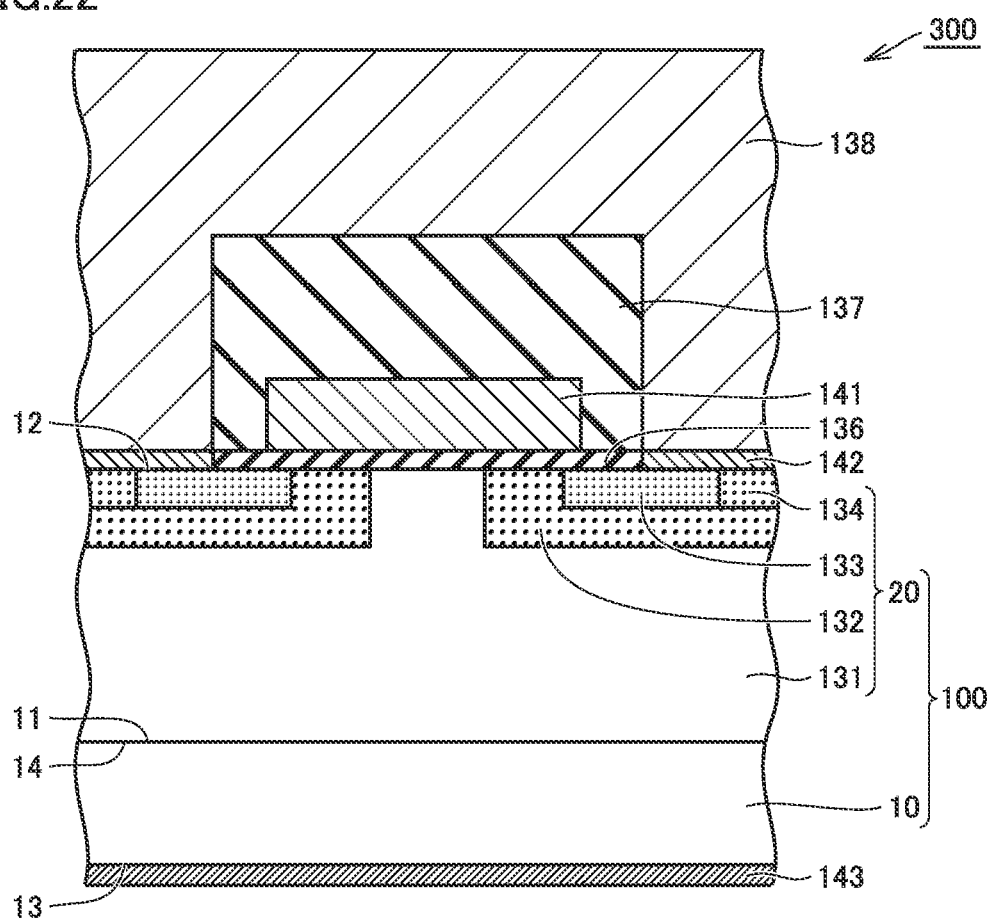
FIG. 22 is a schematic cross-sectional view showing a third step of the method of manufacturing a silicon carbide semiconductor device according to the present embodiment.

Then, the dicing step (S24: FIG. 19) is performed. For example, as silicon carbide epitaxial substrate 100 is diced along a dicing line, silicon carbide epitaxial substrate 100 is divided into a plurality of semiconductor chips. Silicon carbide semiconductor device 300 is manufactured as above (see FIG. 22).

Though the method of manufacturing a silicon carbide semiconductor device according to the present disclosure is described above with reference to a MOSFET, the manufacturing method according to the present disclosure is not limited as such. The manufacturing method according to the present disclosure is applicable to various silicon carbide semiconductor devices such as an insulated gate bipolar transistor (IGBT), a Schottky barrier diode (SBD), a thyristor, a gate turn off thyristor (GTO), and a PiN diode.

It should be understood that the embodiment disclosed herein is illustrative and non-restrictive in every respect. The scope of the present invention is defined by the terms of the claims, rather than the embodiment above, and is intended to include any modifications within the scope and meaning equivalent to the terms of the claims.

REFERENCE SIGNS LIST 1 first position; 2 second position; 3 line segment; 4 least square line; 5 center; 6, 8 point; 7, 9 contact point, tangent; 10 single crystal substrate; 11 first main surface; 12 second main surface; 13 third main surface (surface); 14 fourth main surface (surface); 15 cross-sectional profile; 20 silicon carbide layer; 30 side end surface; 31, 84 orientation flat; 32 curvature portion; 33 lower arc portion (end portion); 34 central arc portion; 35 upper arc portion (end portion); 36 virtual surface; 41 lower region; 43 upper region; 50 laser displacement meter; 51 light emitting element; 52 light receiving element; 53 incident light; 54 reflected light; 55 stage; 57 surface profiling system; 61 first grindstone; 62 second grindstone; 65, 71 holder; 67 axis of rotation; 68 third grindstone; 80 single crystal ingot; 81 upper surface; 82 lower surface; 83 side surface; 85 curved surface portion; 91 base; 92 protection portion; 93 wire saw; 95 recess; 96 surface; 100 silicon carbide epitaxial substrate; 101 amount of warpage; 102 region; 103 end region (first end region); 104 central town area; 105 outer periphery; 131 drift region; 132 body region; 133 source region; 134 contact region; 136 oxide film; 137 interlayer insulating film; 138 interconnection layer; 141 first electrode; 142 second electrode; 143 third electrode; and 300 silicon carbide semiconductor device

The invention claimed is:

1. A silicon carbide single crystal substrate comprising:
a first main surface; and
an orientation flat extending in a <11-20> direction,
the first main surface including an end region extending by at most 5 mm from an outer periphery of the first main surface, and
in a direction perpendicular to the first main surface, an amount of warpage of the end region continuous to the orientation flat being not greater than 3 μm,
a polytype of the silicon carbide single crystal substrate being 4H-SiC, and
a maximum diameter of the first main surface being not smaller than 150 mm.

2. The silicon carbide single crystal substrate according to claim 1, wherein
when a cross-section which divides the orientation flat perpendicularly into two equal sections when viewed in the direction perpendicular to the first main surface is viewed, toward the orientation flat, the end region is warped upward in a direction away from a surface opposite to the first main surface, and
the amount of warpage represents a distance between a point of contact between the orientation flat and the first main surface and a point where a least square line calculated from a cross-sectional profile of the first main surface in a region extending from a position distant by 3 mm from the orientation flat toward a center of the first main surface to a position distant by 5 mm from the orientation flat intersects with the orientation flat.

3. The silicon carbide single crystal substrate according to claim 1, wherein
when a cross-section which divides the orientation flat perpendicularly into two equal sections when viewed in the direction perpendicular to the first main surface is viewed, toward the orientation flat, the end region is warped downward in a direction toward a surface opposite to the first main surface, and
the amount of warpage represents a distance between a point of contact between the orientation flat and the first main surface and a point where a least square line calculated from a cross-sectional profile of the first main surface in a region extending from a position distant by 3 mm from the orientation flat toward a center of the first main surface to a position distant by 5 mm from the orientation flat intersects with a virtual plane extending along the orientation flat.

4. The silicon carbide single crystal substrate according to claim 1, wherein
the amount of warpage is not greater than 2 μm.

5. The silicon carbide single crystal substrate according to claim 4, wherein
the amount of warpage is not greater than 1 µm.

6. A silicon carbide epitaxial substrate comprising:
the silicon carbide single crystal substrate according to claim 1; and
a silicon carbide layer on the first main surface,
the silicon carbide layer including a second main surface opposite to a surface in contact with the first main surface, and
the second main surface being free from a stacking fault extending in a <1-100> direction from the orientation flat and having a length not shorter than 1 mm.

7. A method of manufacturing a silicon carbide semiconductor device comprising:
preparing the silicon carbide epitaxial substrate according to claim 6; and
processing the silicon carbide epitaxial substrate.

8. The silicon carbide single crystal substrate according to claim 1, wherein
when a line segment which divides the orientation flat perpendicularly into two equal sections is divided into four equal sections when viewed in the direction perpendicular to the first main surface, the first main surface includes a lower region extending from the orientation flat to a position corresponding to ¼ of the line segment, and
the amount of warpage of the end region continuous to an end portion of the lower region is not greater than 3 µm.

9. A silicon carbide epitaxial substrate comprising:
the silicon carbide single crystal substrate according to claim 8; and
a silicon carbide layer on the first main surface,
the silicon carbide layer including a second main surface opposite to a surface in contact with the first main surface, and
the second main surface being free from a stacking fault extending in a <1-100> direction from the end portion of the lower region and having a length not shorter than 1 mm.

10. The silicon carbide single crystal substrate according to claim 1, wherein
when a line segment which divides the orientation flat perpendicularly into two equal sections is divided into four equal sections when viewed in the direction perpendicular to the first main surface, the first main surface includes an upper region extending from an end portion opposite to the orientation flat to a position corresponding to ¼ of the line segment, and
the amount of warpage of the end region continuous to the end portion of the upper region is not greater than 3 µm.

11. A silicon carbide epitaxial substrate comprising:
the silicon carbide single crystal substrate according to claim 10; and
a silicon carbide layer on the first main surface,
the silicon carbide layer including a second main surface opposite to a surface in contact with the first main surface, and
the second main surface being free from a stacking fault extending in a <1-100> direction from the end portion of the upper region and having a length not shorter than 1 mm.

12. The silicon carbide single crystal substrate according to claim 1, wherein
when a line segment which divides the orientation flat perpendicularly into two equal sections is divided into four equal sections when viewed in the direction perpendicular to the first main surface, the first main surface includes a lower region extending from the orientation flat to a position corresponding to ¼ of the line segment and an upper region extending from an end portion opposite to the orientation flat to a position corresponding to ¼ of the line segment, and
the amount of warpage of the end region continuous to an end portion of the lower region is not greater than 3 nm and the amount of warpage of the end region continuous to the end portion of the upper region is not greater than 3 nm.

13. A silicon carbide epitaxial substrate comprising:
the silicon carbide single crystal substrate according to claim 12; and
a silicon carbide layer on the first main surface,
the silicon carbide layer including a second main surface opposite to a surface in contact with the first main surface, and
the second main surface being free from a stacking fault extending in a <1-100> direction from the end portion of the lower region and having a length not shorter than 1 mm and from a stacking fault extending in the <1-100> direction from the end portion of the upper region and having a length not shorter than 1 mm.

* * * * *